(12) United States Patent
Oh

(10) Patent No.: US 7,886,122 B2
(45) Date of Patent: Feb. 8, 2011

(54) METHOD AND CIRCUIT FOR TRANSMITTING A MEMORY CLOCK SIGNAL

(75) Inventor: Jong-Hoon Oh, Chapel Hill, NC (US)

(73) Assignee: Qimonda North America Corp., Cary, NC (US)

( * ) Notice: Subject to any disclaimer, the term of this patent is extended or adjusted under 35 U.S.C. 154(b) by 150 days.

(21) Appl. No.: 11/466,312

(22) Filed: Aug. 22, 2006

(65) Prior Publication Data

US 2008/0052481 A1 Feb. 28, 2008

(51) Int. Cl.
*G06F 12/00* (2006.01)
(52) U.S. Cl. ...................................................... 711/167
(58) Field of Classification Search ........................ None
See application file for complete search history.

(56) References Cited

U.S. PATENT DOCUMENTS

| 6,134,638 | A * | 10/2000 | Olarig et al. ................ 711/167 |
| 7,032,092 | B2 | 4/2006 | Lai |
| 7,100,012 | B2 * | 8/2006 | Sager ........................... 711/167 |
| 7,209,397 | B2 * | 4/2007 | Ware et al. ................... 365/194 |
| 7,243,254 | B1 * | 7/2007 | Kuroodi et al. .............. 713/600 |
| 2003/0012076 | A1 * | 1/2003 | Mizuno et al. ............... 365/233 |
| 2003/0067834 | A1 | 4/2003 | Lai |
| 2006/0282694 | A1 * | 12/2006 | Ichikawa ..................... 713/322 |
| 2007/0247933 | A1 * | 10/2007 | Kagan ......................... 365/193 |

OTHER PUBLICATIONS

JEDEC Standard, Double Data Rate (DDR) SDRAM Specification, JESD79, Release 1, Jun. 2000, USA.

* cited by examiner

*Primary Examiner*—Hiep T Nguyen
(74) *Attorney, Agent, or Firm*—Patterson & Sheridan, L.L.P.

(57) ABSTRACT

Embodiments of the invention generally provide a method and apparatus for transmitting and receiving clock signals. In one embodiment, the method includes receiving, at a memory device, a first clock signal and a second clock signal. The frequency of the first clock signal may be less than the frequency of the second clock signal. The method further includes performing two or more data access operations using the second clock signal. One of the two or more data access operations may include a read operation and one of the two or more data access operations may include a write operation. The method also includes performing a command processing operation using the first clock signal.

28 Claims, 5 Drawing Sheets

METHOD AND CIRCUIT FOR TRANSMITTING A MEMORY CLOCK SIGNAL

BACKGROUND OF THE INVENTION

1. Field of the Invention

The invention generally relates to clock signals used in electronic devices. Specifically, embodiments of the invention are related to clock signals used in memory devices.

2. Description of the Related Art

Modern computers systems typically include a memory device which may be accessed and/or controlled by a control device such as a processor or memory controller. In some cases, the memory device may perform operations at a higher speed than the internal clock speed of the control device. Where the memory device performs operations at a higher speed than the clock speed of the control device, the control device may use the internal clock to generate a faster clock signal such as a double-frequency clock signal with twice the frequency of the internal clock used by the control device. The generated double-frequency clock signal may then be provided to the memory device by the control device and used by the memory device to perform necessary operations.

The operations performed by the memory device using the double frequency clock signal may include memory access operations. For example, if the memory device is a double data rate (DDR) type memory device, the memory device may perform read and write operations on both the rising and falling edges of the double frequency clock signal provided by the control device. Memory accesses may also include activation or refreshes of memory addresses.

The memory device may also use the double frequency clock signal to read command data and address data from the control device and provide timing to control circuitry in the memory device. In some cases, the memory device may not receive command and address data as frequently as memory access operations are performed. For example, while memory access operations may be performed on both the rising and falling edges of the double frequency clock signal, the memory device may only read command and address data from the control device on alternate rising edges of the double frequency clock signal (e.g., at the frequency of the internal clock signal of the control device). Accordingly, while the memory device may use the double frequency clock signal to process command data and address data, the memory device may not receive command data and address data at every edge of the double frequency clock signal.

Typically, circuits operating at higher speeds (e.g., the memory device using the double-frequency clock signal) consume more power. Accordingly, in a memory device as described above, where command data and address data are processed using the double-frequency clock signal, the memory device may consume more power. However, where command data and address data in the memory device are not received as frequently as the performance of read and write operations, using the double frequency clock signal to process command data and address data and provide timing to control circuitry in the memory device may be unnecessary. Thus, using the double frequency clock signal to process command data and address data may unnecessarily consume power in the memory device. In some cases, for example, where the memory device is used in a battery operated device (e.g., as part of an embedded system), such increased power consumption may be undesirable.

Furthermore, in some cases, using the double frequency clock signal to process command data and address data may place unnecessary timing requirements on the transmission of command data and address data between the memory device and control device. For example, using the double frequency clock signal to process command data and address data may place inconvenient design constraints on the circuitry in the control device and the memory device which transmits and receives the command data and the process data (e.g., designing the circuitry for the higher speed transmission may be more costly).

Accordingly, what are needed are improved methods and apparatuses for providing clock signals to a memory device.

SUMMARY OF THE INVENTION

Embodiments of the invention generally provide a method and apparatus for transmitting and receiving clock signals. In one embodiment, the method includes receiving, at a memory device, a first clock signal and a second clock signal. The frequency of the first clock signal may be less than the frequency of the second clock signal. The method further includes performing two or more data access operations using the second clock signal. One of the two or more data access operations may include a read operation and one of the two or more data access operations may include a write operation. The method also includes performing a command processing operation using the first clock signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and, unless explicitly present, are not considered elements or limitations of the appended claims.

Embodiments of the invention generally provide a method and apparatus for transmitting and receiving clock signals. In one embodiment, the method includes receiving, at a memory device, a first clock signal and a second clock signal. The frequency of the first clock signal may be less than the frequency of the second clock signal. The method further includes performing two or more data access operations using the second clock signal. One of the two or more data access operations may include a read operation and one of the two or more data access operations may include a write operation. The method further includes performing a command processing operation using the first clock signal. In one embodiment, the method also includes receiving command data and address data for the command processing operation using the first clock signal.

As described above, circuits operating at higher speeds typically consume more power performing operations. In some cases, by using the first clock signal (with the frequency which is lower than the frequency of the second clock signal) instead of the second clock signal to perform a command processing operation, the memory device may consume less power performing the operation while still using the second clock signal to perform data access operations at the higher frequency of the second clock signal. Furthermore, by using the first clock signal to receive command data and address data for the command processing operation at the slower frequency of the first clock signal, the timing requirements for transmitting the command data and address data may be reduced (e.g., it may be simpler to transmit the command data and address data more slowly than using the faster frequency of the second clock signal), thereby reducing the cost of the circuitry used to transmit or receive the command data and address data.

Figure 1:
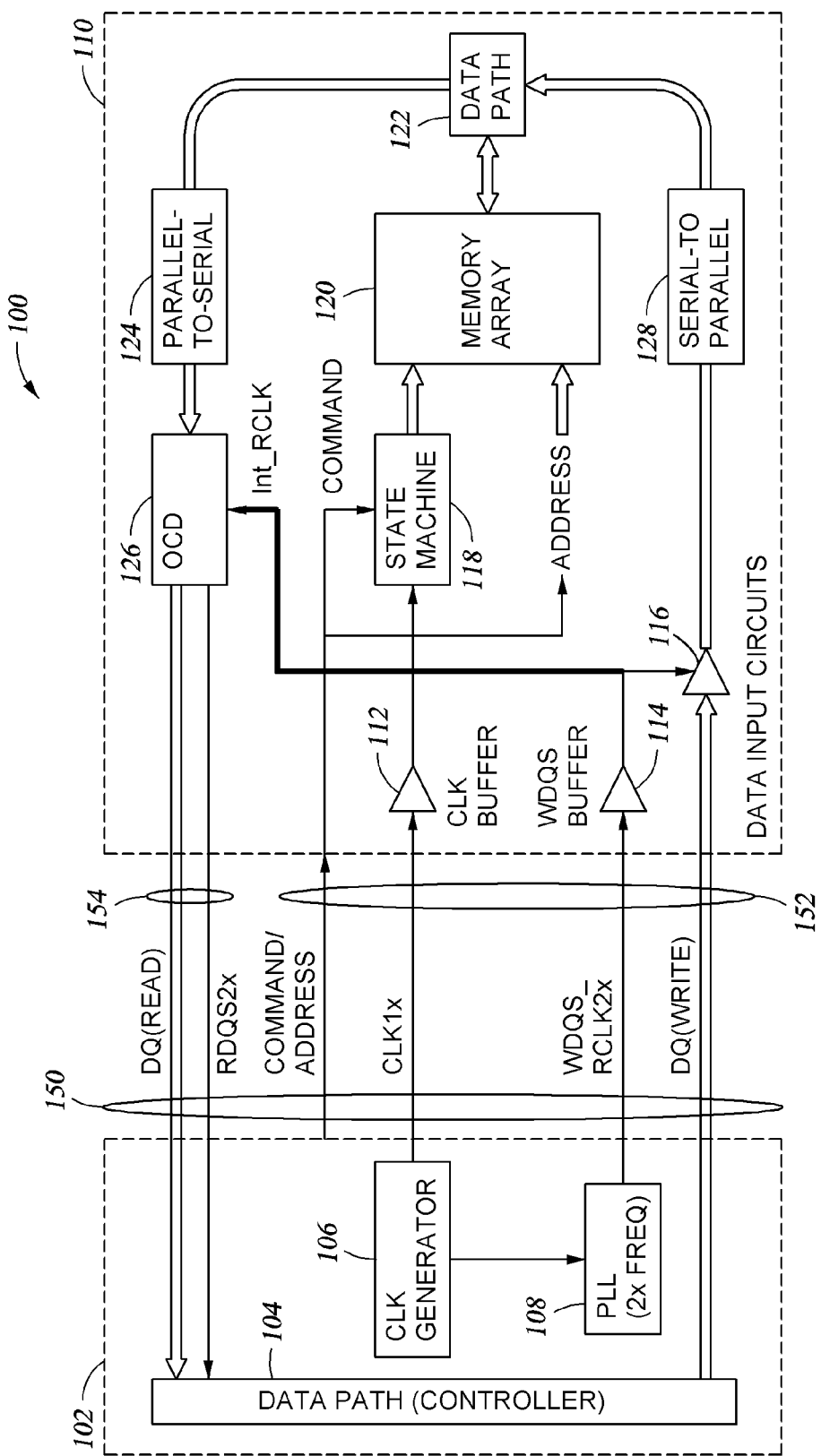
FIG. 1 is a block diagram depicting a system including a memory and a control device according to one embodiment of the invention.

FIG. 1 is a block diagram depicting a system 100 including a memory device 110 and a control device 102 according to one embodiment of the invention. The description below provides exemplary control devices 102 and memory devices 110 which may be used within the system 110. The description below also provides an overview of the interface 150 between the control device 102 and the memory device 110, the components of the control device 102 and the memory device 110, and performance of data access (e.g., reads and writes) between the control device 102 and the memory device 110.

In one embodiment of the invention, the control device 102 may include a processor, memory controller, or any other device. The memory device 110 may also include any type of memory device. For example, in one embodiment, the memory device may be a volatile memory device such as a dynamic, random access memory (DRAM) device. Where the memory device 110 is a DRAM device, the DRAM may be a double-data rate (e.g., DDR, DDR1, DDR2, or graphics-type DDR) type memory device including a low-power type (LP-DDR) memory device as specified by the Joint Electron Device Engineering Council (JEDEC) LP-DDR synchronous dynamic random access memory (SDRAM) Specification.

As depicted, the control device 102 may communicate to the memory device 110 across a memory interface 150. As described above, in one embodiment of the invention, the memory interface 150 may include an interface which conforms to the JEDEC LP-DDR SDRAM Specification. The memory interface may include signals 152 provided by the control device 102 to the memory device 110 as well as signals 154 provided by the memory device 110 to the control device 102. The signals 152 provided by the control device 102 may include a first clock signal (CLK1$x$), a second clock signal (WDQS_RCLK2$x$), command and address signals (COMMAND/ADDRESS), and a write data signal (DQ). The signals 154 provided by the memory device 110 may include a read clock signal (RDQS2$x$) and a data signal (DQ). While depicted with respect to separate read signals 154 and write signals 152, embodiments of the invention may be utilized with a single data bus line (DQ). In some cases, where a single data bus line DQ is utilized, read operations and write operations may not be performed simultaneously across the data bus DQ. The use of the signals transmitted across interface 150 is described in greater detail below with respect to timing of read and write operations within the memory device 110.

Data in the memory device 100 may be stored in a memory array 120. During a read from or write to the memory array 120, the data path 122 may be used to route data within the memory device 110. For example, during a write of data from the control device 102 to the memory device 110, the memory device 110 may receive a write command and write address. The memory device 110 may process the write command in the state machine 118. In one embodiment, the write data for the write command may be received serially via data input buffer 116, converted from serial to parallel within the serial to parallel converter 128, and written into the memory array 122 at the write address via data path 122.

Similarly, during a read of data from the memory device 110 to the control device 102, the memory device 110 may receive a read command and read address. The memory device 110 may process the read command in the state machine 118. The data being read may be retrieved from the memory array 120 at the read address. In one embodiment, the read data may be retrieved in parallel and routed via the data path 122 to a parallel to serial converter 124. The serial read data may then be transmitted from the parallel to serial converter to an off-chip driver (OCD) 126 which is used to transmit the read data to the control device 102.

The use of clock signals transmitted across the interface 150 to perform data transfers between the control device 102 and the memory device 110 is now described below with respect to FIGS. 2-5.

Providing and Receiving Clock Signals for Data Accesses

In one embodiment of the invention, to synchronize transfer of commands, addresses, and data across the interface 150, the control device 102 may provide multiple clock signals (e.g., a first clock signal and a second clock signal) to the memory device 110. As described above, by providing a first clock signal with a first frequency and a second clock signal with a second frequency (higher than the first frequency) to the memory device 110, the memory device 110 may conserve power by receiving and processing commands and addresses with the first clock signal while maintaining high data transfer rates by using the second clock signal for data transfer during both read and write operations. Where the second clock signal is used for single data rate (SDR) transfer of information between the control device 102 and the memory device 110, data for a given command may be transferred between the control device 102 and the memory device 110 on a rising edge of the second clock signal. Where the second clock signal is used for double data rate (DDR) transfer of information, data for a given command may be transferred on both the rising edge of the clock signal and the falling edge of the second clock signal.

Figure 2:
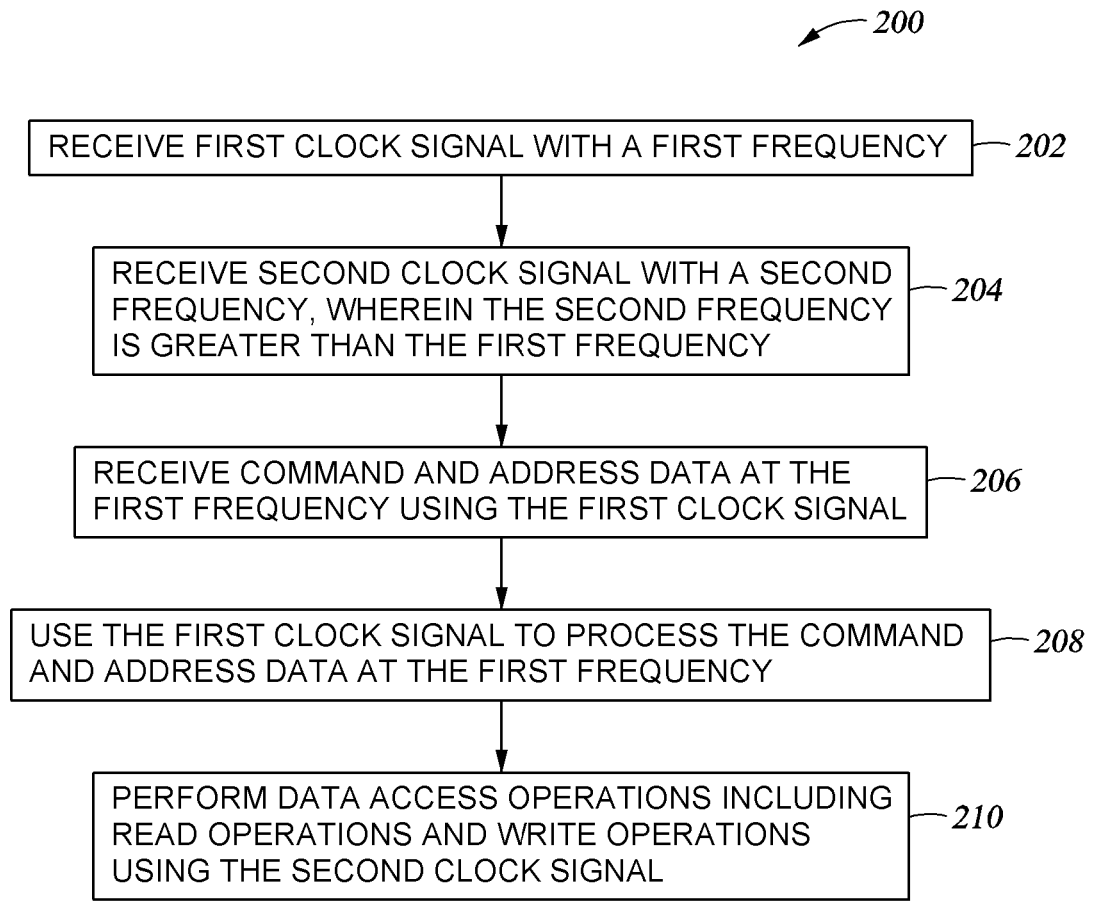
FIG. 2 is a flow diagram depicting a process for receiving clock signals at a memory device according to one embodiment of the invention.

FIG. 2 is a flow diagram depicting a process 200 for receiving clock signals at the memory device 110 according to one embodiment of the invention. The process 200 may begin at step 202 where a first clock signal with a first frequency is received. As depicted in FIG. 1, the first clock signal (CLK1x) may be received by a first clock buffer 112 (CLK buffer). At step 204, a second clock signal with a second frequency may be received. The second frequency may be greater than the first frequency. As depicted in FIG. 1, the second clock signal (WDQS_RCLK2x) may be received by a second clock buffer 114 (WDQS buffer).

At step 206, command and address data may be received at the first frequency using the first clock signal, and at step 208 the first clock signal may be used to process the command and address data at the first frequency. As depicted in FIG. 1, the command and address may be received across the COMMAND/ADDRESS bus and provided to the state machine 118 and the memory array 120. The first clock signal, received at the first clock buffer, may be provided to the state machine 118 where the first clock signal is used to process the received command and address data. As described above, by using the first clock signal with the lower frequency to receive and process the command and address data, the memory device 110 may conserve power.

At step 210 data access operations, including, for example, read operations and write operations may be performed using the second clock signal. For example, with respect to write operations, the second clock signal received at the second clock buffer 114 may be used to receive data at the data input circuit 114. With respect to read operations, the clock signal received at the second clock buffer 114 may be transmitted as an internal clock signal (Int_RCLK) to off chip driver circuitry 126 where the internal clock signal is used to generate a read clock signal (RDQS2x). In one embodiment of the invention, the read clock signal may have the same frequency as the second clock signal. The read clock signal may be provided to the control device 102 and read data may be output to the control device 102 using the read clock signal to synchronize the data being output.

As described above, by using the received second clock signal to perform read and write operations, the memory device 110 may be able to perform the read and write operations at the increased frequency of the second clock signal, thereby providing increased data access rates for the memory device 110. Furthermore, in one embodiment, as depicted in FIG. 1, the memory device 110 may be able to use the second clock signal to perform read and write operations without using a delay-locked loop circuit or phase-locked loop circuit to produce additional clock signals in the memory device 110. In some cases, by omitting such circuitry within the memory device 110, power consumption within the memory device 110 may be reduced.

Figure 3:
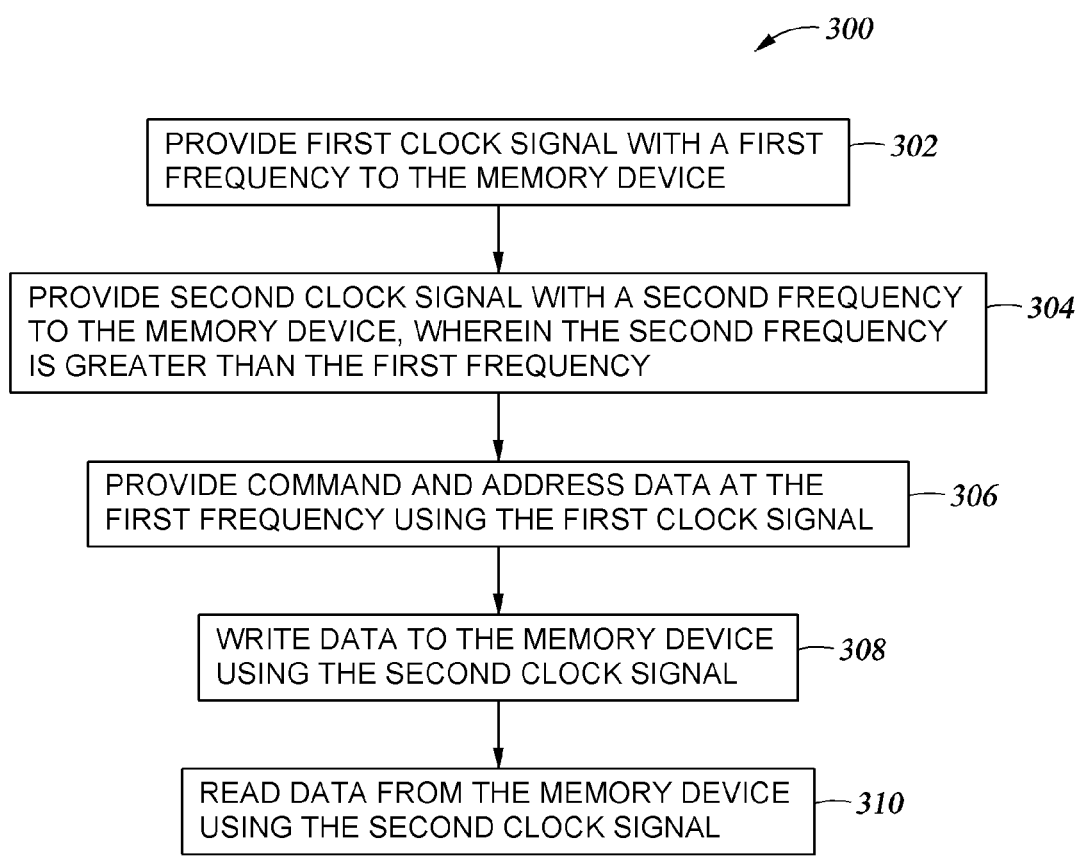
FIG. 3 is a flow diagram depicting a process for providing clock signals to a memory device according to one embodiment of the invention.

Having described the process 200 of receiving and using the first clock signal and second clock signal by the memory device 110, a process 300 of providing the first clock signal and the second clock signal to the memory device 110 is now described with respect to FIG. 3.

FIG. 3 is a flow diagram depicting the process 300 for providing clock signals from the control device 102 to the memory device 110 according to one embodiment of the invention. The process 300 may begin at step 302 where the first clock signal with the first frequency is provided to the memory device 110. As depicted in FIG. 1, the first clock signal CLK1x may be generated, for example, by a clock generator circuit 106 and provided across the interface 150.

At step 304, the second clock signal with the second frequency may be provided to the memory device 110. As described above, the second frequency of the second clock signal may be greater than the first frequency of the first clock signal. In one embodiment of the invention, as depicted in FIG. 1, the second clock signal may be generated in the control device 102 using the same clock signal generated by the clock signal generator 106. For example, the signal from the clock signal generator 106 may be provided to a phase-locked loop (PLL) circuit 108. The phase-locked loop circuit 108 may, for example, produce the second clock signal.

In one embodiment of the invention, the second clock signal produced by the phase-locked loop circuit 108 may have a second frequency which is an integer multiple (e.g., where the integer multiple is two or larger) of the first frequency of the first clock signal. Furthermore, in one embodiment, the second clock signal produced by the phase-locked loop circuit 108 may be in phase with the first clock signal. In some cases, by maintaining the first clock signal and the second clock signal in phase with each other, read operations and write operations beginning with the issuance of a read command or write command on a given edge of the first clock signal may be synchronized with a subsequent data transfer (e.g., a read of data or a write of data) which may begin in an integral number of clock cycles (of the second clock signal) later. Embodiments of the invention may also be used where the first clock signal and the second clock signal are not in phase with each other.

At step 308, data may be written to the memory device 110 using the second clock signal to synchronize the data bits being written. Also, at step 310, read data may be read from the memory device 110 using the second clock signal. For example, as described above, the second clock signal may be provided back as a read clock signal from the memory device 110 and used to synchronously transfer data from the memory device 110 to the control device 102. As described above, by using increased frequency of the second clock signal to perform data transfers for read and write operations, the data access rate of the memory device 110 may be maintained at a high level.

Figure 4:
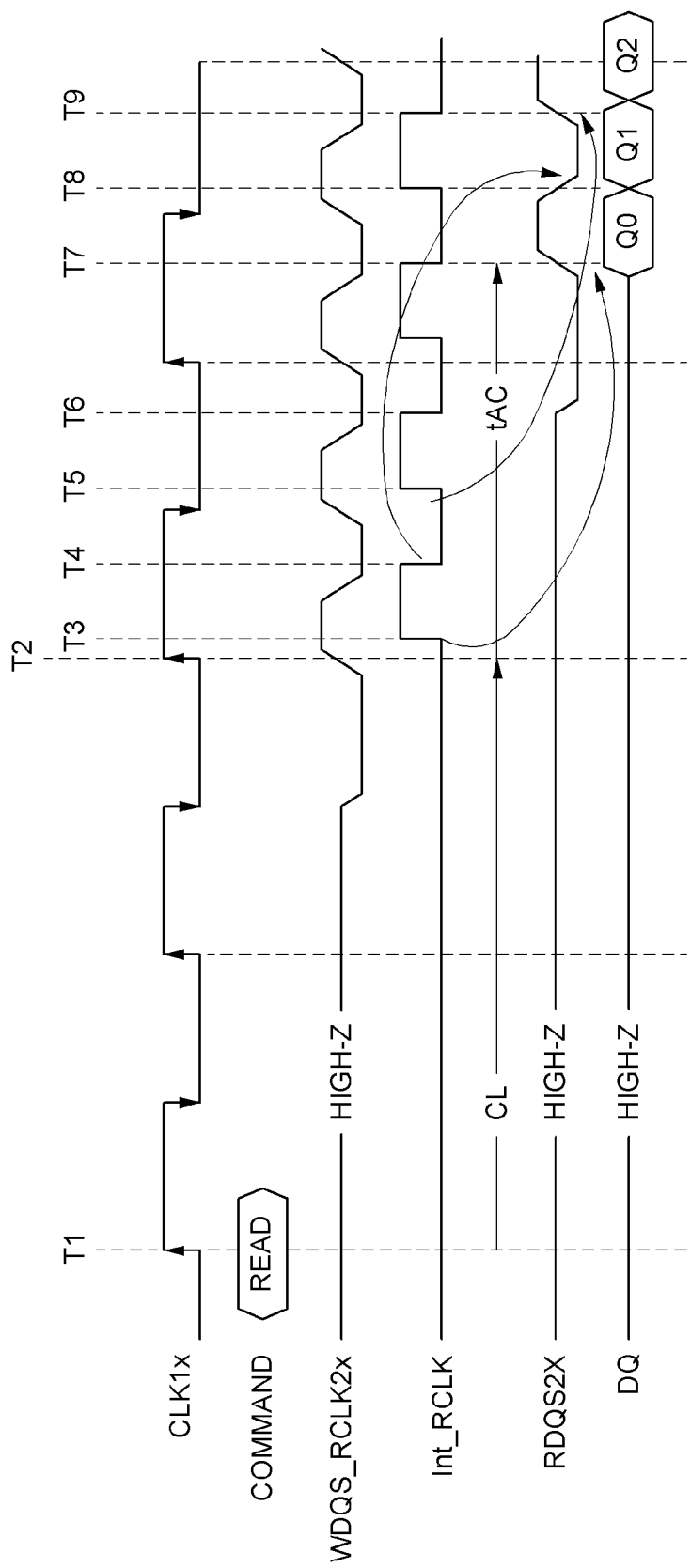
FIG. 4 is a timing diagram depicting a read operation according to one embodiment of the invention.
Figure 5:
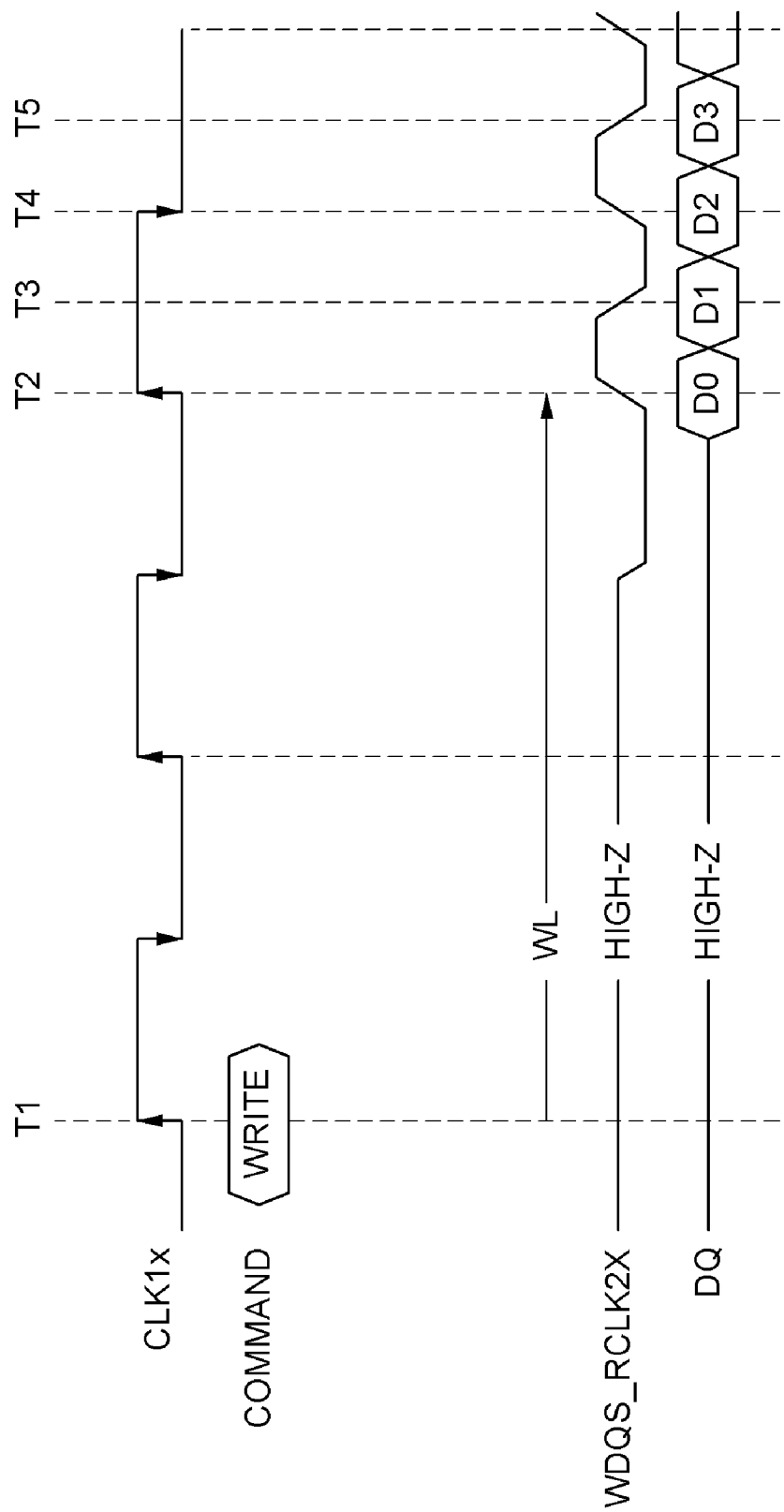
FIG. 5 is a timing diagram depicting a write operation according to one embodiment of the invention.

Having described how the clock signals are provided and used between the control device 102 and the memory device 110, timing diagrams depicting exemplary access operations are now described with respect to FIG. 4 and FIG. 5.

FIG. 4 is a timing diagram depicting a read operation according to one embodiment of the invention. As depicted, the read operation may begin at time T1 where a read command is issued from the control device 102 to the memory device 110 on a rising edge of the first clock signal CLK1x. At some time later (e.g., T2) as specified by the column-address-strobe (CAS) latency (CL), the control device 102 may begin generating the second clock signal WDQS_RCLK2x with clock edges occurring at times T3, T4, T5, T6, etc. The second clock signal may be received by the memory device 110 and provided internally as described above as an internal clock signal Int_RCLK which may have the same frequency as the second clock signal but be slightly delayed with respect to the second clock signal.

After a delay specified by the access time $t_{AC}$, data may be provided from the memory device 110 to the control device. When the data is presented on the data bus DQ by the memory device 110, the read clock signal (RDQS2x) may be produced by the memory device 110, indicating that the data is ready to be read from DQ. In the depicted example, the read data is provided at times T7, T8, T9, etc. Furthermore, as depicted, the read clock signal may be produced by the internal clock signal Int_RCLK. Thus, in one embodiment of the invention, the read clock signal may merely be a delayed version of the second clock signal provided by the control device 102. In some cases, as described above, by merely delaying the second clock signal to obtain the read clock signal (e.g., without using a PLL or DLL circuit), power consumption within the memory device 110 may be reduced while synchronizing the data transfer between the memory device 110 and the control device 102.

FIG. 5 is a timing diagram depicting a write operation according to one embodiment of the invention. As depicted, the write operation may begin at time T1 where a write command is transmitted from the control device 102 to the memory device 110 on a rising edge of the first clock signal (CLK1x). At a later time (T2) indicated by the write latency (WL) the transfer of write data from the control device 102 to the memory device 110 may begin. As depicted, at times T2, T3, T4, T5, etc., the control device 102 may provide the second clock signal (WDQS_RCLK2x) to the memory device 102 while transmitting a bit of data across the data bus DQ on each rising edge and falling edge of the second clock signal.

In one embodiment of the invention, as depicted in FIG. 4 and FIG. 5, the first clock signal may be generated and provided to the memory device 110 while the system 100 is operating. However, with respect to the second clock signal, in one embodiment the second clock signal may only be provided to memory device 110 when a read operation or write operation is being performed. For example, when a read operation or write operation is not being performed, the control device 102 may maintain the connection used to transmit the second clock signal in a high impedance state (High-Z). Similarly, in one embodiment, when a read operation or write operation is not being performed, the control device 102 may not use the phase-locked loop circuit 108 to produce the second clock signal, thereby conserving power in the control device 102. Optionally, the control device 102 may constantly generate the second clock signal using the phase-locked loop circuit 108. Furthermore, in one embodiment, the second clock signal may be constantly provided to the memory device 110.

As described above, embodiments of the invention generally provide a method and apparatus for transmitting and receiving clock signals. In one embodiment, the method includes receiving, at a memory device, a first clock signal and a second clock signal. The frequency of the first clock signal may be less than the frequency of the second clock signal. The method further includes performing two or more data access operations using the second clock signal. One of the two or more data access operations may include a read operation and one of the two or more data access operations may include a write operation. The method also includes performing a command processing operation using the first clock signal.

While the foregoing is directed to embodiments of the present invention, other and further embodiments of the invention may be devised without departing from the basic scope thereof, and the scope thereof is determined by the claims that follow.

What is claimed is:

1. A method for transmitting clock signals, the method comprising:
   receiving, at a memory device, a first clock signal and a second clock signal, wherein a frequency of the first clock signal is less than a frequency of the second clock signal;
   performing two or more data access operations using the second clock signal, wherein at least one of the two or more data access operations includes a read operation and wherein at least one of the two or more data access operations includes a write operation; and
   performing a command processing operation using the first clock signal.

2. The method of claim 1, further comprising:
   performing a read operation with the second clock signal wherein separate read data are provided at rising and falling edges of a read clock signal generated from the second clock signal; and
   performing a write operation with the second clock signal wherein separate write data are received at rising and falling edges of the second clock signal.

3. The method of claim 2, further comprising:
   generating the read clock signal from the second clock signal, wherein the read clock signal has a frequency which matches the frequency of the second clock signal.

4. The method of claim 3, wherein the read clock signal is generated without a phase-locked loop circuit and wherein the read clock signal is generated without a delay-locked loop circuit.

5. The method of claim 1, wherein the frequency of the second clock signal is twice the frequency of the first clock signal.

6. The method of claim 1, wherein the memory device receiving the first clock signal and the second clock signal is a dynamic, random access memory (DRAM) memory device.

7. The method of claim 1, wherein the first clock signal and the second clock signal are received across a low-power, double-data rate (LP-DDR) interface.

8. The method of claim 1, further comprising:
   receiving command data and address data for the command processing operation using the first clock signal.

9. A method for providing clock signals to a memory device, the method comprising:
   providing, to the memory device, a first clock signal and a second clock signal, wherein a frequency of the first clock signal is less than a frequency of the second clock signal;
   providing command data to the memory device using the first clock signal;
   performing a read operation from the memory device using the second clock signal; and
   performing a write operation to the memory device using the second clock signal.

10. The method of claim 9, wherein, while performing the read operation with the second clock signal, separate read data are read at rising and falling edges of a read clock signal generated from the second clock signal and wherein, while performing the write operation with the second clock signal, separate write data are written at rising and falling edges of the second clock signal.

11. The method of claim 10, wherein a frequency of the read clock signal matches the frequency of the second clock signal.

12. The method of claim 11, wherein the read clock signal is not generated from the second clock signal by a phase-locked loop circuit and wherein the read clock signal is not generated from the second clock signal by a delay-locked loop circuit.

13. The method of claim 9, wherein the frequency of the second clock signal is twice the frequency of the first clock signal.

14. The method of claim 9, wherein the memory device is a dynamic, random access memory (DRAM) memory device.

15. The method of claim 9, wherein the first clock signal and the second clock signal are provided across a low-power, double-data rate (LP-DDR) interface.

16. A memory device comprising:
   a memory array;
   an interface to a control device; and
   circuitry configured to:

receive a first clock signal and a second clock signal via the interface, wherein a frequency of the first clock signal is less than a frequency of the second clock signal;

perform two or more data access operations using the second clock signal, wherein at least one of the two or more data access operations includes a read operation wherein data is read from the memory array and wherein at least one of the two or more data access operations includes a write operation where data is written to the memory array; and perform a command processing operation using the first clock signal.

17. The memory device of claim 16, wherein the circuitry is further configured to:

perform a read operation with the second clock signal wherein separate read data are provided at rising and falling edges of a read clock signal generated from the second clock signal; and perform a write operation with the second clock signal wherein separate write data are received at rising and falling edges of the second clock signal.

18. The memory device of claim 17, wherein the circuitry is further configured to:

generate the read clock signal from the second clock signal, wherein the read clock signal has a frequency which matches the frequency of the second clock signal.

19. The memory device of claim 18, wherein the read clock signal is generated without a phase-locked loop circuit and wherein the read clock signal is generated without a delay-locked loop circuit.

20. A device comprising:
an interface to a memory device; and
circuitry configured to:
provide, to the memory device, a first clock signal and a second clock signal via the interface, wherein a frequency of the first clock signal is less than a frequency of the second clock signal;
provide command data to the memory device using the first clock signal;
perform a read operation from the memory device using the second clock signal; and
perform a write operation to the memory device using the second clock signal.

21. The device of claim 20, wherein, while performing the read operation with the second clock signal, separate read data are read at rising and falling edges of a read clock signal generated from the second clock signal and wherein, while performing the write operation with the second clock signal, separate write data are written at rising and falling edges of the second clock signal.

22. The device of claim 21, wherein a frequency of the read clock signal matches the frequency of the second clock signal.

23. The device of claim 22, wherein the read clock signal is not generated from the second clock signal by a phase-locked loop circuit and wherein the read clock signal is not generated from the second clock signal by a delay-locked loop circuit.

24. A memory device comprising:
means for storing data;
means for interfacing a control device; and
circuitry configured to:
receive a first clock signal and a second clock signal via the means for interfacing, wherein a frequency of the first clock signal is less than a frequency of the second clock signal;
perform two or more data access operations using the second clock signal, wherein at least one of the two or more data access operations includes a read operation wherein data is read from the means for storing data and wherein at least one of the two or more data access operations includes a write operation where data is written to the means for storing data; and
perform a command processing operation using the first clock signal.

25. The memory device of claim 24, wherein the circuitry is further configured to:

perform a read operation with the second clock signal wherein separate read data are provided at rising and falling edges of a read clock signal generated from the second clock signal; and perform a write operation with the second clock signal wherein separate write data are received at rising and falling edges of the second clock signal.

26. The memory device of claim 25, wherein the circuitry is further configured to:

generate the read clock signal from the second clock signal, wherein the read clock signal has a frequency which matches the frequency of the second clock signal.

27. The memory device of claim 26, wherein the read clock signal is generated without a phase-locked loop circuit and wherein the read clock signal is generated without a delay-locked loop circuit.

28. A system comprising:
a memory device; and
a control device configured to:
provide, to the memory device, a first clock signal and a second clock signal via the interface, wherein a frequency of the first clock signal is less than a frequency of the second clock signal;
provide command data to the memory device using the first clock signal;
perform a read operation from the memory device using the second clock signal, wherein the memory device is configured to process a read command for the read operation using the first clock signal and to provide a read clock signal generated from the second clock signal to the control device during transmission of read data for the read operation; and
perform a write operation to the memory device using the second clock signal, wherein the memory device is configured to process a write command for the write operation using the first clock signal.

* * * * *